United States Patent
Forutanpour et al.

(10) Patent No.: US 9,146,595 B2
(45) Date of Patent: Sep. 29, 2015

(54) SYSTEMS AND METHODS FOR REMOTELY MONITORING OR CONTROLLING A BATTERY

(75) Inventors: Babak Forutanpour, Carlsbad, CA (US); Larissa Dantsker, San Diego, CA (US); William T. Frantz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/252,130

(22) Filed: Oct. 3, 2011

(65) Prior Publication Data

US 2013/0148283 A1 Jun. 13, 2013

Related U.S. Application Data

(60) Provisional application No. 61/515,750, filed on Aug. 5, 2011.

(51) Int. Cl.
| | |
|---|---|
| G08B 3/00 | (2006.01) |
| G06F 1/18 | (2006.01) |
| G01R 31/36 | (2006.01) |
| H02J 7/00 | (2006.01) |
| H01M 10/42 | (2006.01) |
| H01M 10/48 | (2006.01) |
| H04Q 9/00 | (2006.01) |
| G06F 17/00 | (2006.01) |

(52) U.S. Cl.
CPC ............ *G06F 1/189* (2013.01); *G01R 31/3606* (2013.01); *G06F 17/00* (2013.01); *H01M 10/425* (2013.01); *H01M 10/4207* (2013.01); *H01M 10/482* (2013.01); *H02J 7/0004* (2013.01); *H04Q 9/00* (2013.01); *G01R 31/3689* (2013.01); *H01M 2010/4278* (2013.01); *H04Q 2209/40* (2013.01); *H04Q 2209/823* (2013.01)

(58) Field of Classification Search
None
See application file for complete search history.

(56) References Cited

U.S. PATENT DOCUMENTS

| | | | | |
|---|---|---|---|---|
| 5,365,217 A | * | 11/1994 | Toner | 340/539.11 |
| 6,084,523 A | * | 7/2000 | Gelnovatch et al. | 340/636.1 |

(Continued)

FOREIGN PATENT DOCUMENTS

| | | |
|---|---|---|
| CN | 102142186 A | 8/2011 |
| JP | 2000261854 A | 9/2000 |

OTHER PUBLICATIONS

International Search Report and Written Opinion—PCT/US2012/049793—ISA/EPO—Mar. 26, 2013.

(Continued)

*Primary Examiner* — Julie Lieu
(74) *Attorney, Agent, or Firm* — Jeffrey D. Jacobs

(57) ABSTRACT

A battery system for monitoring a battery-operated electronic device includes one or more battery cells for operating the electronic device, an electronic processor for monitoring electrical activity of the one or more battery cells; and a wireless communication module for communicating with a remote electronic device via a network based on the electrical activity. Registration information, including a unique identity of the battery system, may be received at the remote electronic device. A first signal, including the unique identity, may be received at the remote electronic device during use of the battery system. A second signal may be transmitted from the remote electronic device to a communication device in response to receiving the first signal.

51 Claims, 4 Drawing Sheets

(56) References Cited

U.S. PATENT DOCUMENTS

| | | | |
|---|---|---|---|
| 6,794,849 B2 | 9/2004 | Mori et al. | |
| 7,089,291 B1* | 8/2006 | Philyaw | 709/217 |
| 7,250,612 B2* | 7/2007 | Pai-Paranjape et al. | 250/461.1 |
| 7,598,880 B2* | 10/2009 | Powell et al. | 340/636.1 |
| 7,715,884 B2* | 5/2010 | Book et al. | 455/572 |
| 8,093,864 B2* | 1/2012 | Wright | 320/134 |
| 8,103,266 B2* | 1/2012 | Fok et al. | 455/423 |
| 8,344,685 B2* | 1/2013 | Bertness et al. | 320/104 |
| 8,362,909 B2* | 1/2013 | Reams | 340/636.15 |
| 2002/0086718 A1* | 7/2002 | Bigwood et al. | 455/572 |
| 2002/0101218 A1* | 8/2002 | Koenck et al. | 320/140 |
| 2005/0009577 A1* | 1/2005 | Kangas et al. | 455/572 |
| 2005/0162172 A1 | 7/2005 | Bertness | |
| 2006/0217152 A1* | 9/2006 | Fok et al. | 455/557 |
| 2007/0182576 A1* | 8/2007 | Proska et al. | 340/636.1 |
| 2009/0098889 A1 | 4/2009 | Barcklay et al. | |
| 2010/0056228 A1* | 3/2010 | Brown et al. | 455/572 |
| 2011/0169450 A1* | 7/2011 | Hudnall et al. | 320/114 |
| 2012/0091813 A1* | 4/2012 | Spurlin et al. | 307/66 |
| 2013/0164567 A1* | 6/2013 | Olsson et al. | 429/7 |
| 2013/0273898 A1* | 10/2013 | Wesby | 455/419 |

OTHER PUBLICATIONS

Friel D. et al., "Smart Battery Data Specification", SBS Implementers Forum, Revision 1.1, Dec. 11, 1998, pp. 1-54, URL: http://sbs-forum.org/specs/sbdat110.pdf.

Kooser A., "Tethercell Magically Turns AA Batteries into Bluetooth devices", Jan. 8, 2013, 2 Page. http://www.cnet.com/8301-34441_1-57562664/tethercell-magically-turns-aa-batteries-into-bluetooth-devices/#ixzz2IgURJHIY.

Levy S., "Nest Gives the Lowly Smoke Detector a Brain—and a Voice", Oct. 8, 2013, 16 pages. http://www.wired.com/business/2013/10/nest-smoke-detector/.

* cited by examiner

SYSTEMS AND METHODS FOR REMOTELY MONITORING OR CONTROLLING A BATTERY

CROSS-REFERENCE TO RELATED PATENT APPLICATIONS

This application claims priority from Provisional U.S. 61/515,750, filed Aug. 5, 2011, incorporated herein by reference in its entirety.

BACKGROUND

1. Field

This disclosure relates generally to battery systems and methods for use in powering electronic devices. More particularly, the disclosure relates to battery systems and methods for monitoring and/or controlling a state of the battery systems and/or electronic devices powered by the battery systems.

2. Related Art

Batteries are devices for chemically storing electric power and have long been used to power electronic devices. These devices have been especially useful in applications where the electronic devices are intended to be used independent of fixed power supplies. For example, portable devices often are powered by batteries.

One type of battery is considered non-rechargeable. These batteries are often referred to in the art as dry cell batteries. A "dry cell" battery essentially includes a metal electrode or graphite rod (elemental carbon) surrounded by a moist electrolyte paste enclosed in a metal cylinder. In the most common type of dry cell battery, the cathode is composed of a form of elemental carbon called graphite, which serves as a solid support for the reduction half-reaction. In an acidic dry cell, the reduction reaction occurs within the moist paste comprised of ammonium chloride ($NHCl_4$) and manganese dioxide ($MnO_2$). A thin zinc cylinder serves as the anode and it undergoes oxidation. This dry cell "couple" produces about 1.5 volts. These "dry cells" can also be linked in series to boost the voltage produced. In the alkaline version or "alkaline battery," the ammonium chloride is replaced by KOH or NaOH. Other types of dry cell batteries are the silver battery in which silver metal serves as an inert cathode to support the reduction of silver oxide ($Ag_2O$) and the oxidation of zinc (anode) in a basic medium. The type of battery commonly used for calculators is the mercury cell. In this type of battery, HgO serves as the oxidizing agent (cathode) in a basic medium, while zinc metal serves as the anode.

Another type of battery is the rechargeable battery. Some of the basic types of rechargeable batteries include nickel cadmium, nickel metal hydride, and lithium ion.

A lithium-ion battery is a high-energy density battery. It uses lithium metallic oxide in its positive electrode, or cathode, and carbon material in its negative electrode, or anode. Lithium ions inside the battery transfer between the positive electrode and the negative electrode during charge or discharge.

Remotely monitoring or controlling electronic devices operated by such batteries generally requires additional equipment that is expensive (e.g., WiFi, routers, IP-based devices, etc.) and/or complicated to configure (e.g., setting passwords, configuring IP devices, etc.).

SUMMARY

A method of monitoring a state of a battery-operated electronic device from a remote electronic device, the electronic device having a battery system for operating the electronic device, the battery system having one or more battery cells, an electronic processor, and a wireless communication module, may include (but is not limited to) any one or combination of (i) receiving, at the remote electronic device, registration information for the battery system of the electronic device, the registration information comprising a unique identity of the battery system; (ii) receiving, at the remote electronic device, a first signal during use of the battery system, the first signal comprising the unique identity of the battery system; and (iii) transmitting a second signal from the remote electronic device to a communication device in response to receiving the first signal.

A battery system for monitoring a battery-operated electronic device may include (but is not limited to) a housing, one or more battery cells, an electronic processor, and a wireless communication module. The housing may be for receiving in and removing from the electronic device. The one or more battery cells may be arranged within the housing, the one or more battery cells for operating the electronic device. The electronic processor may be for monitoring electrical activity of the one or more battery cells. The wireless communication module may be for communicating with a remote electronic device via a network based on the electrical activity.

A method of controlling a battery-operated electronic device from a remote electronic device, the electronic device having a battery system for operating the electronic device, the battery system having one or more battery cells and a wireless communication module, may include (but is not limited to) any one or combination of: (i) receiving, at the remote electronic device, registration information for the battery system of the electronic device, the registration information comprising a unique identity of the battery system; (ii) receiving, at the remote electronic device, a first signal from a communication device, the first signal corresponding to the unique identity of the battery system; and (iii) sending a second signal from the remote electronic device to the battery system based on the unique identity in response to receiving the first signal, the second signal for controlling the electronic device based on the first signal.

A battery system for controlling a battery-operated electronic device may include (but is not limited to) a housing, one or more battery cells, an electronic processor, and a wireless communication module. The housing may be for receiving in and removing from the electronic device. The one or more battery cells may be arranged within the housing, the one or more battery cells for operating the electronic device. The wireless communication module may be for receiving a signal from a remote electronic device via a network. The electronic processor may be for controlling electrical activity of the one or more battery cells based on the signal.

DETAILED DESCRIPTION

Figure 1:
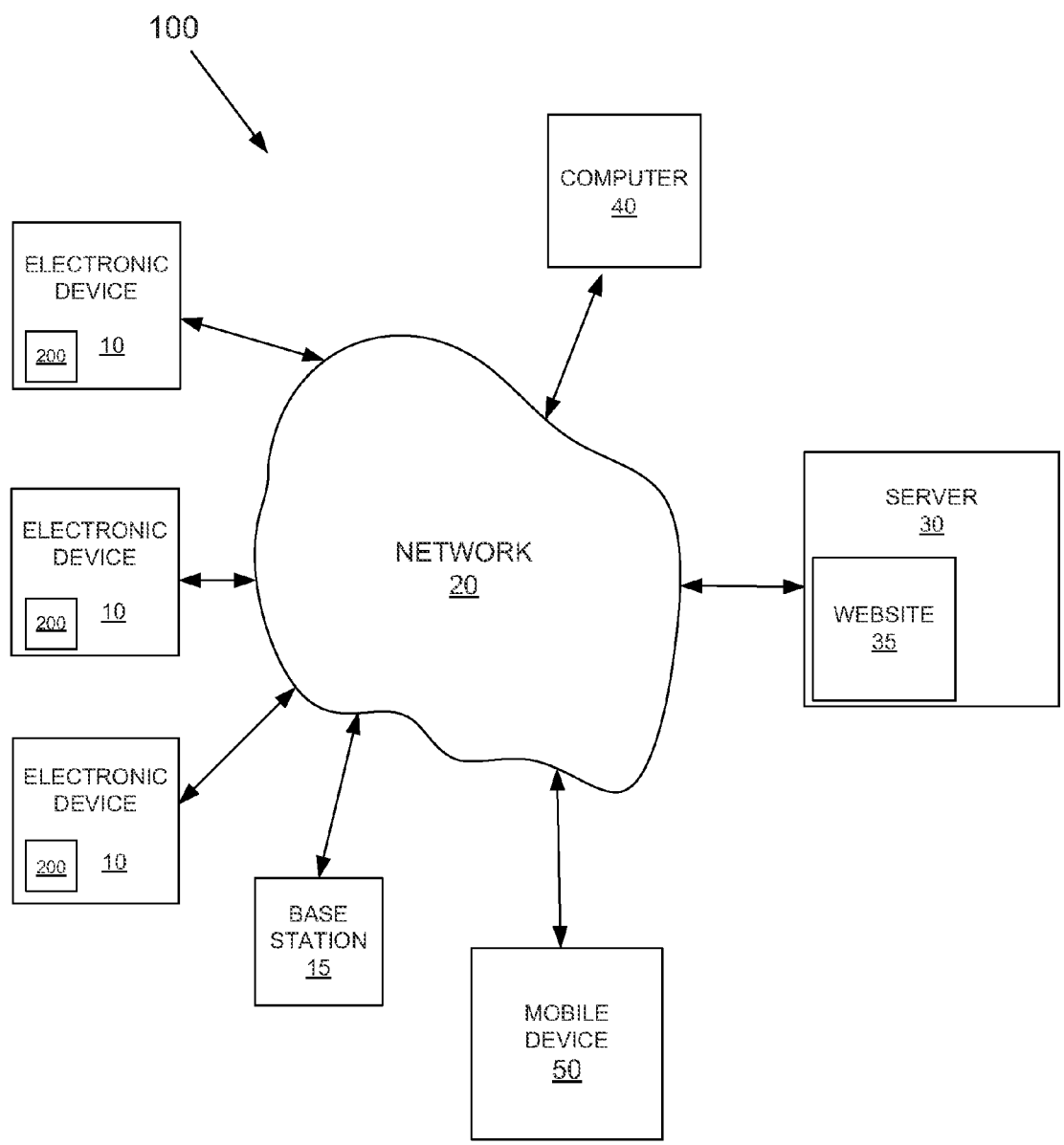
FIG. 1 is an exemplary network environment 100 according to an embodiment of the disclosure.

FIG. 1 is an exemplary network environment 100 including at least one electronic device 10 that is powered by a battery system 200. The electronic device 10 may be any battery-operated electronic device, such as (but not limited to), a smoke detector, carbon monoxide detector, toy (e.g., electronic doll), and/or the like.

In various embodiments, the battery system 200 is able to transmit and/or receive data and information over a wireless communication interface (e.g., network 20). Coupled with the network 20 are one or more servers exemplified by server 30. In some embodiments, a website 35 may reside on the server 30. The network 20 may represent one or both of local area networks (LAN) and wide area networks (WAN) and/or any other network environment. For example, the battery system 200 in for one of the electronic devices 10 may be coupled to the server 30 via a WAN (e.g., Internet). As another example, the battery system in another electronic device 10 may be coupled to a base station 15, such as hub or router, or other electronic device (e.g., computer 40), via a LAN. The base station 15 may be coupled to the server 30 via a WAN or a router or the like that can communicate with the server 30.

The battery system 200 may be used in the electronic device 10 in place of or addition to a standard (rechargeable or non-rechargeable) battery. For instance, the battery system 200 may function like (but not limited to) a 9V, AA, AAA, C, D, lantern battery, or the like. Thus, for example, instead of using a standard 9V battery in a smoke detector, an appropriately sized and configured battery system 200 (e.g., having the same size dimensions and/or electrical characteristics as the 9V battery) may be used to operate the smoke detector. As another example, instead of using four standard AAA batteries in an electronic toy, one (or more) an appropriately sized and configured battery system 200 may be used along with three (or fewer) standard AAA batteries.

Figure 2A:
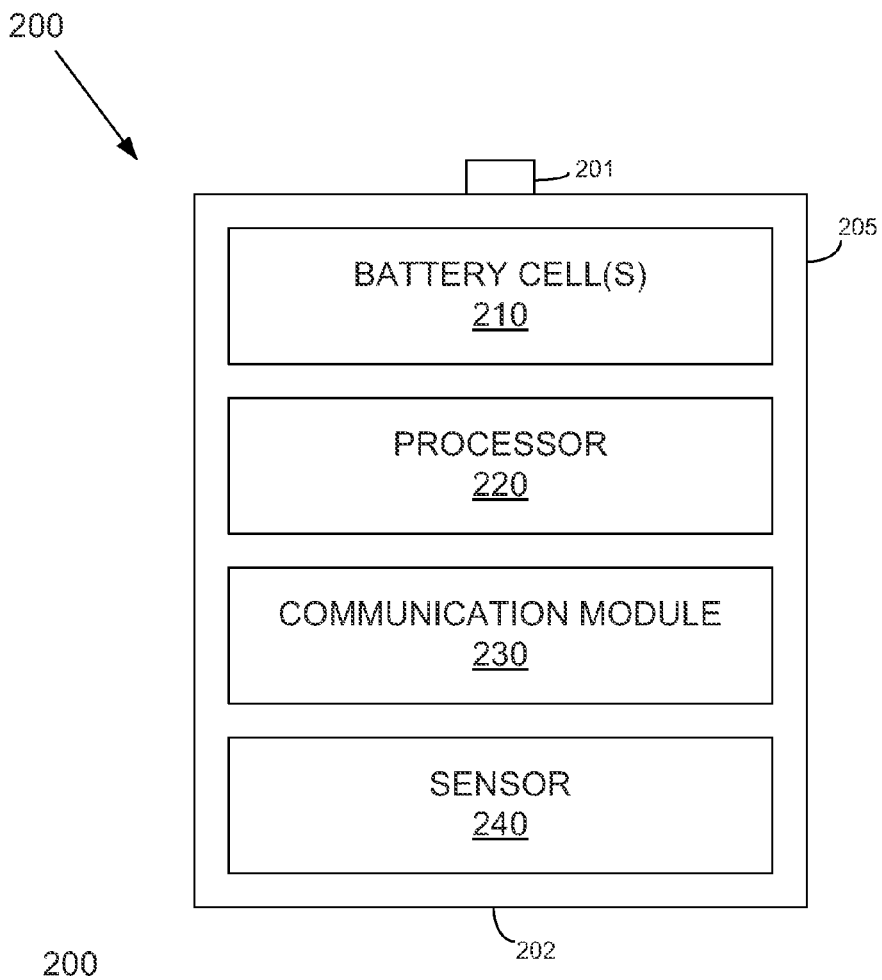
FIG. 2A is a block diagram of a battery system according to an embodiment of the disclosure.
Figure 2B:
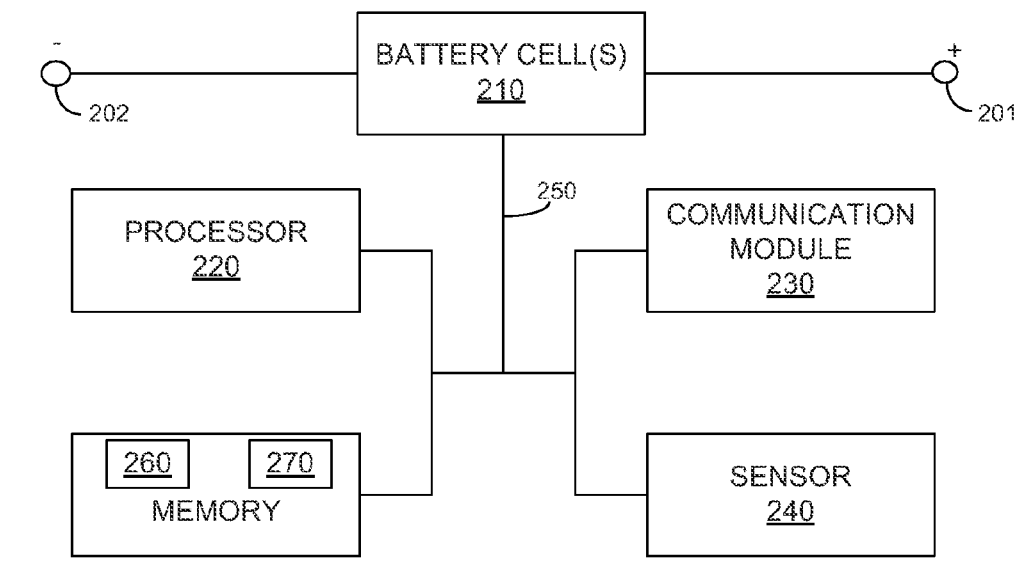
FIG. 2B is a block diagram of a battery system according to an embodiment of the disclosure.

FIG. 2A illustrates an exemplary configuration of the battery system 200. FIG. 2B illustrates an exemplary circuitry configuration of the battery system 200. With reference to FIGS. 1-2B, the battery system 200 includes a housing 205. The housing 205 includes one or more battery cells 210, a processor 220, and a communication module 230. The housing 205 may be sized and shaped based on the type of standard battery, such as (but not limited to) 9V, AA, AAA, C, D, lantern, or the like, the battery system 200 is intended to replace (or supplement).

The battery cells 210 are used to power an electronic device (e.g., electronic device 10) to which the battery system 200 is electrically connected. The battery cells 210 may also be used to power one or more of the components (e.g., the processor 220, the communication module 230, sensors, and/or the like). The battery cells 210 may be selected to provide sufficient spacing in the housing 205 for additional components and provide sufficient power to operate the electronic device 10. For instance, in particular embodiments where the battery system 200 is used as a 9V PP3 battery, the battery cells 210 are high-density rechargeable lithium PP3 battery cells. Such embodiments allow for smaller battery cells thus providing additional space for the other components of the battery system 200 within the housing 205. In other embodiments, the battery cells 210 may be any suitable type of rechargeable or non-rechargeable battery cell including, but not limited to, nickel cadmium, nickel metal hydride, lithium ion, alkaline, and/or the like.

The battery system 200 includes an address/data bus 250 for communicating information between one or more of the components of the battery system 200. The processor 220 is coupled with the bus 250 for processing information and instructions. The components may be configured to communicate with each other using interfaces such as (but not limited to) one or more universal serial bus (USB) interfaces, micro-USB interfaces, universal asynchronous receiver-transmitter (UART) interfaces, general purpose input/output (GPIO) interfaces (e.g., inter-integrated circuit (i2C)), control/status lines, control/data lines, shared memory, and/or the like.

In some embodiments, the battery system 200 may include a volatile memory 260 (e.g., random access memory, RAM) coupled with the bus 250 for storing information and instructions for the processor 220 and/or a non-volatile memory 270 (e.g., read only memory, ROM) coupled with the bus 250 for storing static information and instructions for the processor 220. In other embodiments, memory may be implemented using any machine-readable or computer-readable media capable of storing data such as (but not limited to) volatile memory or non-volatile memory, removable or nonremovable memory, erasable or non-erasable memory, writeable or re-writeable memory, and/or the like. Examples of machine-readable storage media may include, without limitation, random-access memory (RAM), dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), or any other type of media suitable for storing information. In some embodiments, PC board 215 or the like can contain, for example, the processor 220, the bus 250, the RAM 260, the ROM 270, and/or the like.

Although the memory 260, 270 may be shown as being separate from the processor 220 for purposes of illustration, in various embodiments, some portion or the entire memory 260, 270 may be included on the same integrated circuit as the processor 220. Alternatively, some portion or the entire memory 260, 270 may be disposed on an integrated circuit or other medium (e.g., hard disk drive) external to the integrated circuit of the processor 220. In various embodiments, the battery system 200 may comprise an expansion slot (not shown) to support a multimedia and/or memory card, for example.

In various embodiments, the battery system 200 may comprise an input/output (I/O) interface coupled to the processor. The I/O interface 44 may comprise one or more I/O devices such as (but not limited to) a serial connection port, an infrared port, integrated Bluetooth® wireless capability, integrated 802.11x (WiFi) wireless capability, and/or the like to enable wired (e.g., USB cable) and/or wireless connection to a local device, such as the hub 15, a local personal computer (PC) 40, and/or the like. In various embodiments, the battery system 200 may be configured to transfer and/or synchronize information with the local computer system 40. For example, the local computer system 40 may be used to program the battery system 200 (e.g., set preferences).

The battery system 200 also includes the communication module 230. The communication module 230 may comprise one or more transceivers configured to communicate using different types of protocols, communication ranges, operating power requirements, RF sub-bands, information types (e.g., voice or data), use scenarios, applications, and/or the like. In various embodiments, the communication module 230 may comprise one or more transceivers configured to support communication with local devices (e.g., base station 15) using any number or combination of communication standards.

In various embodiments, the communication module 230 can also exchange voice and data signals with devices using any number or combination of communication standards (e.g., GSM, CDMA, TDNM, WCDMA, OFDM, GPRS, EV-DO, WiFi, WiMAX, S02.xx, UWB, LTE, satellite, etc). The techniques described herein can be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network can implement a radio technology such as Universal Terrestrial Radio Access (UTRA), cdma2000, etc. UTRA includes Wideband-CDMA (W-CDMA) and Low Chip Rate (LCR). CDMA2000 covers IS-2000, IS-95, and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). Power for the communication module 230 may be supplied by the battery cells 210.

In various embodiments, the communication module 230 may comprise one or more transceivers configured to perform data communications in accordance with one or more wireless communications protocols such as (but not limited to) WLAN protocols (e.g., IEEE 802.11a/b/g/n, IEEE 802.16, IEEE 802.20, etc.), PAN protocols, Low-Rate Wireless PAN protocols (e.g., ZigBee, IEEE 802.15.4-2003), Infrared protocols, Bluetooth protocols, EMI protocols including passive or active RFID protocols, and/or the like.

The communication module 230 may be coupled to the bus 250 for providing a communication link between the battery system 200 and the network 20. As such, the communication module 230 enables the processor 220 to communicate wirelessly with other electronic systems coupled to the network 20. For instance, the communication module 230 may be coupled to an antenna (not shown) and provides functionality to transmit and receive information over a wireless communication interface.

As such, in various embodiments, the communication module 230 is for communicating with a remote device. For instance, in some embodiments, the communication module 230 is for communicating with a remote device, such as the server 30, via the network 20. In some embodiments, the communication module 230 is for communicating directly with a base station 15 (e.g., hub, router, etc.) or other local device (e.g., computer 40, mobile device 50, etc.). In some embodiments, said other local device may function as the server 30. For example, the other local device may notify the user in alternative of (or in addition to) the server 30.

The communication module 230 may be implemented using one or more chips as desired for a given implementation. Although the communication module 230 may be shown as being separate from and external to the processor 220 for purposes of illustration. In various embodiments, some portion or the entire communication module 220 may be included on the same integrated circuit as the processor 220.

In some embodiments, the battery system 200 may include an antenna system (not shown) for transmitting and/or receiving electrical signals using WWAN protocols, WLAN protocols, and/or the like. For instance, the antenna system may be coupled to the processor 220 through the communication module 230. The antenna system may comprise or be implemented as one or more internal antennas and/or external antennas.

The processor 220 may be responsible for executing various software programs such as application programs and system programs to provide computing and processing operations for the battery system 200. The processor 220 may be responsible for performing various voice and data communications operations for the battery system 200 such as transmitting and receiving voice and data information over one or more wireless communications channels.

In various embodiments, the battery system 200 (e.g., processor 220) is configured to detect a change or deviation in a state or electrical characteristic (e.g., voltage, current, etc.) of the battery cells 210. Typically, changes occur when the electronic device 10, which is coupled to (e.g., powered by) the battery system 200, changes its state or mode of operation from a first state or mode to a second state or mode. Thus, by detecting a change in a state or electrical characteristic of the battery cells 210, a change in a state or mode of an electronic device 10 may be detected. In various embodiments, a change in a state or electrical characteristic may correspond, for example, to a measurement of an electrical characteristic (e.g., voltage) that deviates from a previous measurement, an expected value, an average of measurements, or the like. Expected values may be determined based on, for example (but not limited to), a formula, algorithm, profile of the electronic device 10 (as discussed), user settings, and/or the like. In some embodiments, the battery system 200 is configured to detect a change in an electrical characteristic. In other embodiments, the battery system 200 is configured to detect a rate of change in an electrical characteristic. Thus, in various embodiments, the battery system 200 is configured to detect a first derivative, a second derivative, and/or the like (e.g., other derivatives) of an electrical characteristic.

In particular embodiments, the battery system 200 (e.g., processor 220) is configured to detect a sudden change or deviation in a state or electrical characteristic of the battery cells 210. A sudden change may be, for example, a change (e.g., between measurement at time $t_0$ and time $t_{t-1}$) that exceeds (or is below) a specified threshold, is inside (or is outside) a specified range, and/or the like. As such, sudden changes (e.g., that exceed a threshold) may be distinguished from other changes (e.g., that do not exceed a threshold). In some embodiments, the sudden changes may be processed differently than the other changes. For example, the battery system 200 may transmit data to the server 30 whenever there is a sudden change and perform no action otherwise.

In various embodiments, multiple thresholds, ranges, or the like may be used. For example, if a change exceeds a first threshold, the battery system 200 may perform a first result (e.g., email user at the end of the day). If the change exceeds a second threshold, for example greater than the first threshold, the battery system may perform a second operation (e.g., email user immediately). If the change exceeds a third threshold, for example greater than the second threshold, the battery system 200 may perform a third operation (e.g., email, text, and call user immediately).

In particular embodiments, the processor 220 monitors a state or electrical characteristics, such as (but not limited to)

voltage, current, and/or the like, of the battery cells 210. For instance, the processor 220 may be configured to track a moving average of one or more electrical characteristics over time, determine if the measured electrical characteristic exceeds a predetermined threshold or range, determine if the measured electrical characteristic deviates from an expected value, and/or the like. For example, in some embodiments, the processor 220 may be configured to track a moving average of the voltage (or other electrical characteristic) of the battery cells 210 when the battery system 200 is electrically coupled (e.g., powering) the electronic device 10. As another example, the processor 220 may monitor the voltage of the battery system 200 while powering the electronic device 10 to determine if the monitored voltage exceeds a predetermined threshold.

If a change is detected, the battery system 200 may transmit (e.g., via the communication module 230) data, which relates to the detected event, or otherwise notify the server 30. For example, a battery system 200 powering a smoke detector (e.g., 10) may send a signal to the server 30 that a current of the battery cells 210 measured by the processor 220 exceeds a predetermined threshold. This occurrence, for example, may indicate that the smoke detector is sounding its alarm because of the presence of smoke. In one example for a smoke detector, the measured voltage across leads (e.g., 201, 202) of a battery system 200 used in place of a standard 9V battery is 8.723v when in a monitor mode (e.g., speaker off) and 8.721v in an alert mode (e.g., speaker sounding alarm). Thus, when the battery system 200 detects a voltage drop of, for example, 0.02v, the battery system 200 may send a signal (transmit data) to the server 30.

In some embodiments, the battery system 200 includes a communication circuit (not shown) coupled to the bus 250. The communication circuit includes an optional digital signal processor (DSP) (not shown) for processing data to be transmitted or data received via the communication module 230. In other embodiments, the processor 220 can perform some or all of the functions performed by the DSP.

Figure 3:
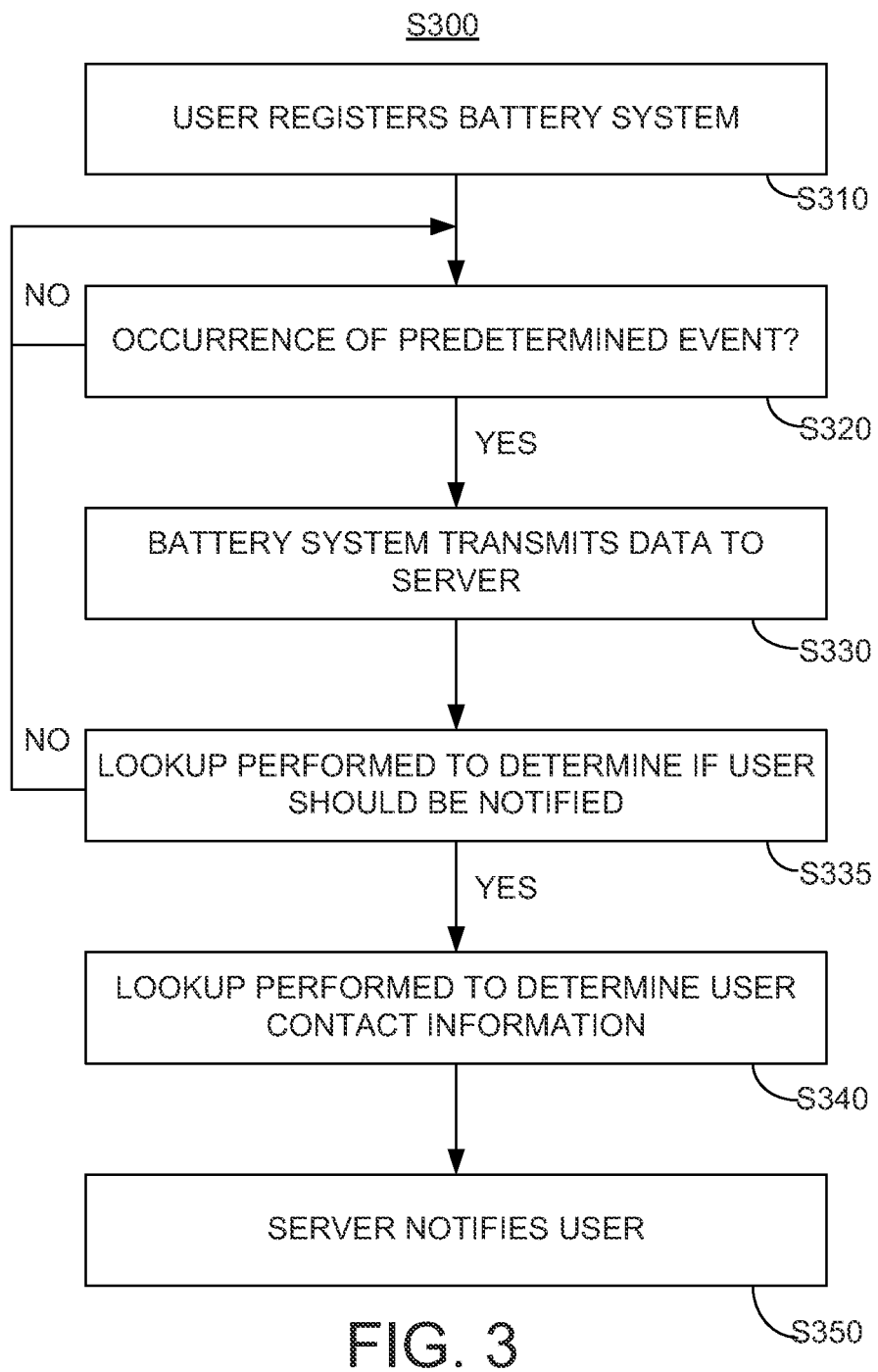
FIG. 3 is a process for notifying a user according to an embodiment of the disclosure.

FIG. 3 is a flowchart of a process 300 for remotely monitoring a state of a battery-operated electronic device (e.g., electronic device 10 operated by battery system 200 of FIG. 1). With reference to FIGS. 1-3, in step S310, a user registers the battery system 200. For instance, the user may login to the website 35 (e.g., on the server 30) via the network 20 to register the battery system 200. In some embodiments, the user registers the battery system 200 after installing the battery system 200 in the electronic device 10. In other embodiments, however, the battery system 200 may be registered at any suitable time, such as before installing the battery system 200, substantially after installing the battery system, or the like.

The battery system 200 can be registered in any number of ways using any website 35 supporting the features of the disclosure. The user may provide a unique identifier for the battery system 200, such as the battery system's serial number, MAC address, or the like. In some embodiments, the user may provide contact information to allow the server 30 to contact the user based upon the occurrence of an event (e.g., a smoke detector going off, charge level of the battery system below a certain threshold, etc.). The contact information may include, but is not limited to, email address, phone number (for receiving a phone call and/or SMS message), physical address, and/or the like.

In some embodiments, at about the time that the battery system 200 is first acquired by the user, the user can log onto the website 35 and set up an account for the battery system 200. The account can be password protected, for example. For instance, the user logs onto the account using the password and enters a unique identifier for the battery system 200, such as the battery system's serial number, MAC address, or the like. In some embodiments, the account is indexed using the unique identifier so that the account can be readily accessed using the unique identifier.

In various embodiments, the user can provide preferences for the account. Some examples of preferences that can be enabled or disabled include, but are not limited to, how the user should be notified (e.g., email, SMS message, phone call, website, etc.), the events of which the user should (or should not) be notified (e.g., device activated or deactivated, charge level of the battery system 200 too low, loss of communication between the battery system 200 and the server 30, etc.), when and/or how often the battery system 200 should operate (e.g., monitor the battery cells, etc.), when the user should be notified (e.g., immediately, daily, only between 9:00 AM and 5:00 PM, etc.), and/or the like.

In some embodiments, the user may provide information relating to the electronic device 10 being operated by the battery system 200. For instance, the user may specify that the battery system 200 being registered is powering a smoke detector. In further embodiments, the user may also specify the specific brand and product, for example by selecting from a drop-down menu or the like, powered by the battery system 200.

In particular embodiments, the user accesses the website 35 to set up the account using the electronic device 10 being operated by the battery system 200. For instance, a display on the electronic device 10 may allow the user to navigate on the website 35. In other embodiments, the battery system 200 may be registered used a different electronic device, such as a computer system 40, mobile device 50 (e.g., cell phone, PDA, tablet, etc.), and/or the like. In some embodiments, the battery system 200 may register itself upon being connected to the electronic device 10. In further embodiments, any additional information (e.g., account information, contact information, etc.) may be provided by the user in advance or later.

In various embodiments, the server 30 may be configured in any suitable manner to allow a user to set up an account and/or receive information from the user. For instance, the server 30 may be configured to receive, for example (but not limited to), information (e.g., battery system unique identifier, account information, electronic device information, contact information, user preferences, and/or the like) from the user via an automated telephone-answering service, SMS message, email message, computer program, or the like.

In various embodiments, the battery system 200 may be configured in any suitable manner to allow a user to set up an account and/or receive information from the user. For instance, the battery system 200 may be configured for wireless communication (e.g., BlueBooth, ZigBee) or wired communication (e.g., USB, ThunderBolt, FireWire, etc.) with a local device, such as the computer 40, the mobile device 50, or the like, to allow the user to set up an account or provide additional information (e.g., unique identifier, electronic device information, contact information, preferences, etc.). In further embodiments, the battery system 200 may transmit (e.g., via the communication module 230) some or all this information to the server 30 or other remote device (e.g., base station 15).

In various embodiments, the base station 15 may be configured in any suitable manner to allow a user to set up an account and/or receive information from the user. For instance, the base station 15 may be configured for wireless communication (e.g., Bluetooth, ZigBee) or wired communication (e.g., USB, ThunderBolt, FireWire, etc.) with a local device, such as the computer 40, the mobile device 50, or the like, to allow the user to set up an account or provide additional information (e.g., unique identifier, electronic device information, contact information, preferences, etc.). In further embodiments, the base station 15 may transmit (e.g., via the communication module 230) some or all this information to the server 30 or other remote device (e.g., base station 15).

In various embodiments, after installing the battery system 200 in the electronic device 10 and registering the battery system 200, the battery system 200 (e.g., processor 220) monitors usage of the battery cells 210 by the electronic device 10 to detect a change in a state or mode of the electronic device 10.

If a sudden change is detected (step S320: YES), then in step S330, the battery system 200 reports the change or otherwise transmits a signal including data associated with the battery system 200 and/or the detected change to the server 30. The signal sent by the battery system 200 may include, but is not limited to, the unique identifier of the battery system 200, information relating to the battery system 200 or usage thereof (e.g., current drawn by the battery cells 210), information relating to the electronic device 10 or usage thereof, and/or the like. If or until a sudden change is detected (step S320: NO), the battery system 200 continues monitoring usage of the battery cells 210.

Next, a lookup is performed at the server 30 based on the data received from the battery system 200. For instance, using the unique identity transmitted by the battery system 200, the account information for the battery system 200 is accessed at the server 30. In some embodiments, in step S335, a lookup is performed at the server 30 to determine if the user should be notified of the change in state. For instance, the determination may be based on the data received from the battery system 200 and the user preferences (e.g., in step S310) of which events he or she should be notified. For example, the user may indicate that for a battery system 200 powering a smoke detector (e.g., 10), he or she should be notified when the alarm sounds, but not to be notified when the charge of the battery system 200 is low.

If the user should be notified (step S335: YES), in step S340, the lookup is performed, for example, to obtain the contact information of the user, for instance as provided in step S310. If the user should not be notified (step S335: NO), the process returns, for example, to step S320.

In step S350, the server 30 notifies of the user of the change in state of the electronic device 10. For instance, the server 30 may cause an email, SMS message, phone call, or the like to be sent to the user at the computer 40, mobile device 50, or the like, for instance, based on the user's preferences (e.g., as set in step S310).

Figure 4:
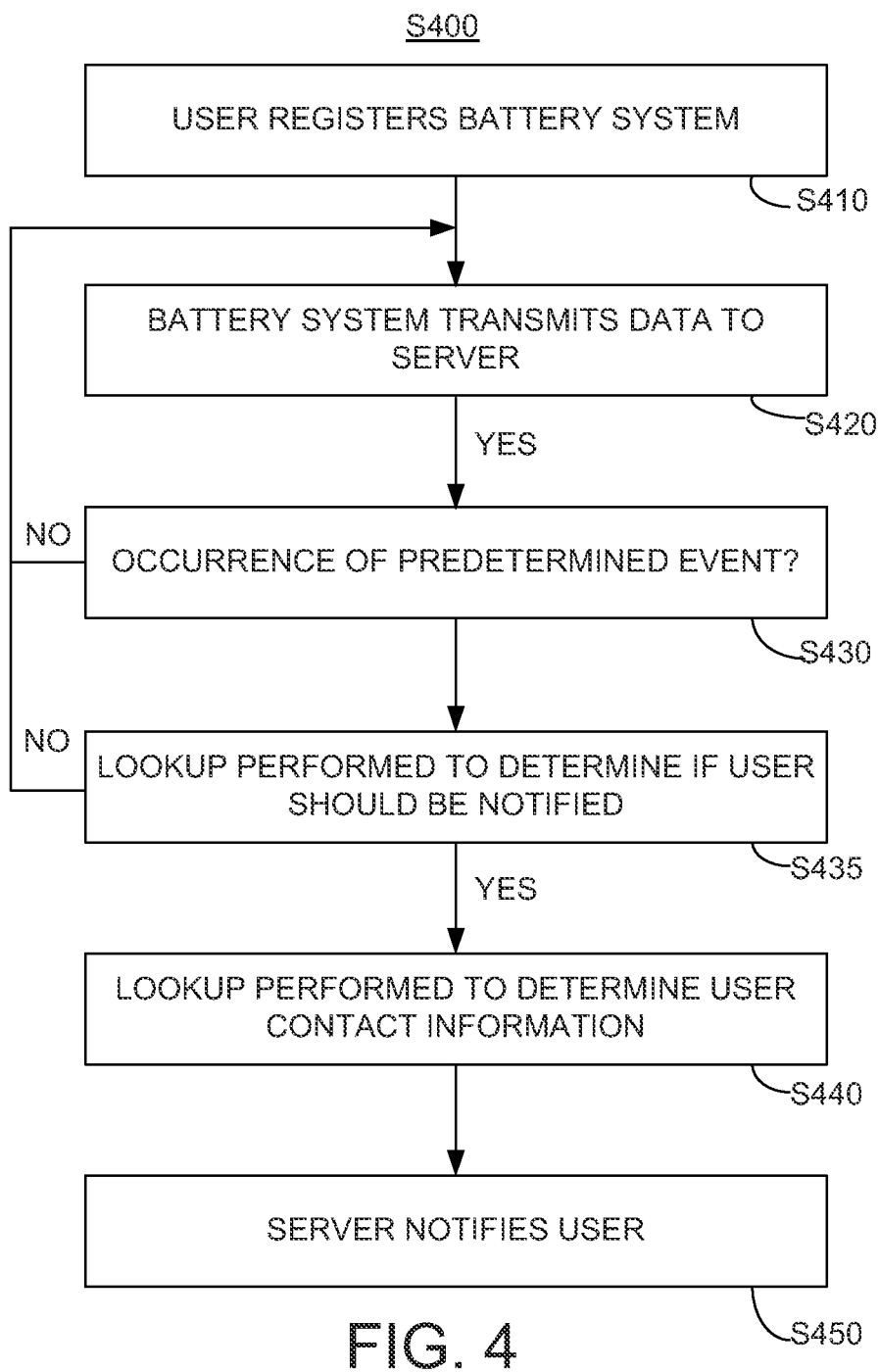
FIG. 4 is a process for notifying a user according to an embodiment of the disclosure.

FIG. 4 is a flowchart of a process 5400 for remotely monitoring a state of a battery-operated electronic device (e.g., electronic device 10 operated by battery system 200 of FIG. 1). With reference to FIGS. 1-4, in step 410, the user registers the battery system 200, for instance as described in the disclosure (e.g., step S310).

After installing the battery system 200 in the electronic device 10 and registering the battery system 200, the battery system 200 (e.g., processor 220) monitors usage of the battery cells 210 by the electronic device 10 to detect a change in a state or mode of the electronic device 10.

In step S420, the battery system 200 transmits a signal including data, which may include the unique identifier of the battery system 200, to the server 30. The data may include electrical characteristics of the battery cells 210, such as (but not limited to) voltage, current, and/or the like.

In some embodiments, the battery system 200 may provide the data continuously or periodically (e.g., every 5 minutes, hourly, daily, etc.). In other embodiments, the battery system 200 may transmit the data upon the change in state or electrical characteristic (e.g., as in step S320). In yet other embodiments, the battery system 200 may transmit the data to the server 30 in response to a user request or a request by the server 30. The user request may be initiated, for example, at the battery system 200, the electronic device 10, or other electronic device (e.g., mobile device 50, computer 40, etc.). The user request may also be initiated at the server 30 to cause the server 30 to request that the battery system 300 transmit data to the server 30. For example, the user can log into the website 35 to check the charge level of the battery system 200. Accordingly, the server 30 may request data from the battery system 200 to determine the charge level. In other embodiments, the data for determining the charge level is already at the server 30 because, for example, the data had been transmitted to the server 30 at an earlier time.

In step S430, the server 30 determines, based on the data received in step S420, whether there has been a sudden change in the electrical characteristics of the battery cells, and thus a sudden change in state or mode of the electronic device 10, for example as described in step S320. Next in steps S435 and S440, a lookup is performed at the server 30 based on the data received from the battery system 200 and information stored at the server 30 (e.g., as provided in step S410). Step S435 may be similar to step S335 and step S440 may be similar to step S340, for example. Then in step S450, the server 30 may notify the user, for example, as described in the disclosure.

In some embodiments, the processor 220 gathers data (e.g., state or characteristics) relating to usage of the battery cells 210 by the electronic device 10. The battery system 200 may transmit the data to the server 30 or other remote device (e.g., base station 15, computer 40) for further analysis (e.g., steps S420-S430 in FIG. 4). For example, the processor 220 may monitor the voltage and transmit the voltage readings to the server 30. The server 30 can process the received voltage readings to determine if there was a sudden change in voltage. In further embodiments, if the server 30 determines that there was a sudden change in voltage, the server 30 may request the battery system 200 to send to the server 30 additional readings of the same characteristic and/or different characteristic to verify the determination. In other embodiments, if the server 30 determines that there was a sudden change in a state or electrical characteristic, the server 30 may analyze newer voltage readings (and/or other data) to verify the determination.

In other embodiments, the processor 220 gathers the data (e.g., state or characteristics) relating to usage of the battery cells 210 by the electronic device 10 and analyzes some or all of the data locally. Then, for instance, based on the analysis, the battery system 200 may send data to the server 30, for example, upon the battery system 200 detecting or determining that there was a sudden change in state (e.g., steps S320-S330 in FIG. 3).

In various embodiments, the server 30 notifies the user at the computer 40, the mobile device 50 (e.g., cell phone), the base station 15, or other suitable electronic device in any suitable manner (e.g., email, SMS message, phone call, etc.), for instance as set in the user preferences. In particular embodiments, the server 30 causes the base station 15 to notify the user at the computer 40, the mobile device 50 (e.g., cell phone), or other suitable electronic device in any suitable manner (e.g., email, SMS message, phone call, etc.), for instance as set in the user preferences.

In other embodiments, the battery system 200 may notify the user at the computer 40, the mobile device 50 (e.g., cell phone), the base station 15, or other suitable electronic device in any suitable manner (e.g., email, SMS message, phone call, etc.), for instance as set in the user preferences. For instance, the battery system 200 may download the contact information, user preferences, and/or the like from the server 30 in advance or when needed. In yet other embodiments, the base station 15 notifies the user at the computer 40, the mobile device 50 (e.g., cell phone), the base station 15, or other suitable electronic device in any suitable manner (e.g., email, SMS message, phone call, etc.), for instance as set in the user preferences. For instance, the base station 15 may download the contact information, user preferences, and/or the like from the server 30 in advance or when needed. Thus, various embodiments allow the battery system 200 to directly notify the user with minimal or no support of the server 30.

In various embodiments, by monitoring a state or characteristics of the battery cells 210, the battery system 200 allows a state or characteristics of the electronic device 10, which is powered by the battery system 200, to be monitored remotely. In some embodiments, by controlling a state or characteristics of the battery cells 210, the battery system 200 allows a state or characteristics of the electronic device 10, which is powered by the battery system 200, to be controlled remotely. Thus, for instance, a user can send a request to the server 30 (e.g., via the website 35, SMS message, mobile device application, etc.) to cause the server 30 to send a signal to the battery system 200 to operate or otherwise control the battery system 200 based on the request. For example, upon receiving a notification that a smoke detector, which is powered by the battery system 200, in the user's home has detected smoke, and the user knows there is no emergency (e.g., after verifying with someone at home that the detected smoke resulted from someone cooking), the user can send a request to the server 30 to disable the speaker alarm. The request from the server 30, for instance, may cause the battery system 200 to discontinue supplying current to or otherwise stop powering the electronic device 10. Thus, in various embodiments, the battery system 200 may be disengaged from the electronic device 10 remotely.

In various embodiments, the server 30 compares the data (e.g., voltage drop) received from the battery system 200 with a database to determine the particular state of the electronic device. The server 30 may include the database. In other embodiments, the server 30 is associated with the database, which is remote from the server 30.

The database may contain profiles for electronic devices. These profiles may be set by the manufacturer (in advance and/or as updates), by the user, other users, or the like. The profiles may contain information of the possible states to which the electronic device 10 may change. For example, in the case where the electronic device 10 is a toy doll, a first voltage drop (e.g., 0.005v) may correspond to the doll being activated by a user, a second voltage drop (e.g., 0.01v) may corresponding to the doll clapping its hands, a third voltage drop (e.g., 0.04v) may correspond to the doll jumping, and a fourth voltage drop (e.g., 0.05v) may correspond to the doll clapping and jumping. Accordingly, if the battery system 200 transmits data (including the battery system unique identifier) to the server 30 that the battery system 200 in the doll had a voltage drop of 0.04v, the server 30 can use the received unique identity to find the appropriate account and determine which electronic device 10 is being powered (e.g., as registered by a user) by the battery system 200. Once the electronic device 10 is known, the server 30 can access the profile for the electronic device 10. The profile can be compared with the voltage drop data to determine that the doll is currently activated and in particular the doll is jumping.

In various embodiments, the comparison of the data and the profile for the electronic device 10 is done by the server 30. In other embodiments, the comparison is done at the battery system 200. For instance, the battery system 200 may download the profile for the electronic device from the server 30. In yet other embodiments, the comparison is performed by other electronic devices, such as (but not limited to), the base station 15, computer 40, and/or the like.

In various embodiments, the battery system 200 notifies the server 30 upon the occurrence of a predetermined event. In some embodiments, the battery system 200 notifies the server 30 when the charge level of the battery cells 210 is low and the battery system 200 needs to be replaced or recharged. In some embodiments, the battery system 200 notifies the server 30 when the battery system 200 is disconnected (or connected) from the electronic device 10.

In some embodiments, the battery system 200 may include a microphone, or be associated with a remote microphone, that is activated to record audio when a change in state occurs. The battery system 200 may transmit the recorded audio to the server 30 (or directly to the user). The server 30 may transmit (or otherwise make available) the received audio to the user (e.g., mobile device 50). For instance, in the case of a motion detector powered by the battery system 200, a change in state corresponding to detecting motion may trigger the microphone to record audio. The user is notified of the event and listens to the audio to determine whether the motion was caused by a family member or pet or by an intruder. In particular embodiments, the battery system 200 includes the microphone. In other embodiments, the microphone is remote from the battery system 200. For instance, the microphone may be part of the base station 15, the computer 40, or itself be a separate electronic device.

In some embodiments, the battery system 200 may include, or be associated with, an image and/or video recorder. The battery system 200 may transmit the recorded audio to the server 30 (or directly to the user). The server 30 may transmit (or otherwise make available) the received audio to the user (e.g., mobile device 50). For instance, in the case of a motion detector powered by the battery system 200, a change in state corresponding to detecting motion may trigger the camera to record images and/or video. The user is notified of the event and views the images and/or video to determine whether the motion was caused by a family member or pet or by an intruder, for example. In particular embodiments, the battery system 200 includes the image and/or video recorder. In other embodiments, the image and/or video recorder is remote from the battery system 200. For instance, the image and/or video recorder may be part of the base station 15, the computer 40, or itself be a separate electronic device.

In some embodiments, the battery system 200 may include a speaker. This may allow the user to communicate with a person near the electronic device 10. For instance, in response to a notification of an event, the user can speak into her or her mobile device 50 (e.g., cell phone). The audio may be sent to the server 30 and then to the battery system 200 (or directly from the mobile device 50 to the battery system 200. Accordingly, for example, if the user determines that there is an intruder (e.g., as detected by a motion detector operated by the battery system 200 and confirmed via video), the user can speak into his or her phone tell the intruder that his presence has been detected (and, for example, recorded) and that the intruder should exit the user's home immediately because the proper authorities will arrive soon.

In some embodiments, when the battery system 200 is connected to the network 20 (e.g., before, upon, or after being installed to the electronic device 10), the battery system 200 automatically connects to the server 30. In particular embodiments, the battery system 200 sends a signal to the server 30 containing its unique identity (e.g., serial number), thereby identifying itself to the server 30. The battery system 200 may also transmit and/or receive additional data (e.g., user preferences, account information, electronic device information, etc.).

In various embodiments, the battery system 200 may be configured to provide voice and/or data communications functionality in accordance with different types of wireless network systems. Examples of wireless network systems may further include (but are not limited to) a wireless local area network (WLAN) system, wireless metropolitan area network (WMAN) system, wireless wide area network (WWAN) system, and the like. Examples of suitable wireless network systems offering data communication services may include (but are not limited to) the Institute of Electrical and Electronics Engineers (IEEE) 802.xx series of protocols, such as the IEEE 802.11 a/b/g/n series of standard protocols and variants (also referred to as "WiFi"), the IEEE 802.16 series of standard protocols and variants (also referred to as "WiMAX"), the IEEE 802.20 series of standard protocols and variants, and the like.

In some embodiments, the battery system 200 may be configured to perform data communications in accordance with different types of shorter range wireless systems (e.g., with base station 15), such as a wireless personal area network (PAN) system. One example of a suitable wireless PAN system offering data communication services may include a Bluetooth system operating in accordance with the Bluetooth Special Interest Group (SIG) series of protocols, including (but not limited to) Bluetooth Specification versions v1.0, v1.1, v1.2, v2.0, v2.0+EDR (Enhanced Data Rate), v2.1+EDR, v3.0+HS (High Speed), v4.0, as well as one or more Bluetooth Profiles, and/or the like.

In various embodiments, the battery system 200 is configured to communicate with other battery systems 200, for example, using a shorter range wireless system or the like. In some embodiments, a first battery system 200 may, for instance directly or via the server 30, access a second battery system 200 via look up of a IP address of the second battery system 200 and determine if the first battery system 200 must report information or data to or control the second battery system 200. For example, when a first smoke detector 10 powered by a first battery system 200 is disabled by the user (e.g., manually, by sending a request via the server 30, hub 15, and/or the like), the first battery system 200 may communicate with the second battery system 200 in a second smoke detector 10 to disable the second smoke detector 10. As another example, if the electronic device 10 powered by the second battery system 200 is powered off, the first battery system 200 may instruct the second battery system 200 to power on its electronic device 10. As a further example, if the second battery system 200 is drawing a current, then the first battery system 200 prevents its electronic device 10 from drawing a current (e.g., because having one smoke detector sounding its alarm is as effective as two smoke detectors sounding their respective alarms, one of the smoke detectors need not sound its alarm).

In some embodiments, the first battery system 200 connects to the server 30 at a certain interval (e.g., every 5 minutes, every 60 seconds, etc.) to determine whether the second battery system 200 (or additional battery system(s)) has come online. In other embodiments, the first battery system 200 connects to the server 30 when manually requested by the user and/or the server 30. The second battery system 200 may come online, for example, upon the user registering the second battery system for use, and specifying whether the second battery system 200 should be recognized or unrecognized by the first battery system 200 and what rules (if any) need to be applied. For example, these rules and IP address of the second battery system 200 can be sent to the first battery system 200 (and/or other battery systems) so that the second battery system 200 no longer needs access the server 30 because the second battery system 200 may process data locally.

In particular embodiments in which multiple battery systems 200 are within communication range, one or more of the battery systems 200 may be designated as a master battery system for communicating over a WAN with the server 30. The other battery systems 200 may communicate over a LAN with the master battery system and have the master battery system report on their behalf. The master battery system may be set by the user and/or be based on battery charge levels, quality of wireless link, and/or the like.

In various embodiments, the battery system 200 is configured to provide (e.g., to the server 30) location or position determination capabilities. The battery system 200 may employ one or more location determination techniques including, for example, Global Positioning System (GPS) techniques, Cell Global Identity (CGI) techniques, CGI including timing advance (TA) techniques, Enhanced Forward Link Trilateration (EFLT) techniques, Time Difference of Arrival (TDOA) techniques, Angle of Arrival (AOA) techniques, Advanced Forward Link Trilateration (AFTL) techniques, Observed Time Difference of Arrival (OTDOA), Enhanced Observed Time Difference (EOTD) techniques, Assisted GPS (AGPS) techniques, hybrid techniques (e.g., GPS/CGI, AGPS/CGI, GPS/AFTL or AGPS/AFTL for CDMA networks, GPS/EOTD or AGPS/EOTD for GSMI GPRS networks, GPS/OTDOA or AGPS/OTDOA for UMTS networks), and/or the like.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. Such hardware, software, firmware, or any combination thereof may part of or implemented with any one or combination of the MS 110 (refer to FIGS. 1A and 1B), the server 170 (refer to FIG. 1B), the wireless device 200 (refer to FIG. 2), and/or the like. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method of monitoring a state of a battery-operated electronic device from a remote electronic device, the battery-operated electronic device having a battery system for operating the battery-operated electronic device, the battery system having one or more battery cells, an electronic processor, and a wireless communication module, the method comprising:
   receiving, at the remote electronic device, registration information for the battery system of the battery-operated electronic device, the registration information comprising a unique identity of the battery system;
   receiving, at the remote electronic device, a first signal during use of the battery system, the first signal comprising the unique identity of the battery system; and
   transmitting a second signal from the remote electronic device to a communication device in response to receiving the first signal;
   wherein receiving the registration information and receiving the first signal comprising receiving from the battery system wireless communication module.

2. The method of claim 1, wherein the first signal includes data relating to use of the battery system by the electronic device.

3. The method of claim 2, the method further comprising:
   determining a state of the battery-operated electronic device based on the first signal.

4. The method of claim 3, wherein determining a state comprises comparing the data relating to use of the battery system by the battery-operated electronic device with a profile for the battery-operated electronic device.

5. The method of claim 4, wherein the second signal includes data indicating the determined state of the battery-operated electronic device.

6. The method of claim 1, wherein the first signal is received in response to a change in state of the battery system.

7. The method of claim 1, wherein the first signal is received in response to an electrical parameter measured by the battery system exceeding a predetermined threshold.

8. The method of claim 1, wherein the second signal is transmitted in response to an electrical parameter measured by the battery system exceeding a predetermined threshold system.

9. The method of claim 1, wherein the remote electronic device comprises a server.

10. The method of claim 1, wherein the first signal is received from a routing device in response to the routing device receiving a signal upon use of the battery-operated electronic device.

11. The method of claim 10, wherein the second signal is sent from the remote electronic device to the communication device via the routing device.

12. The method of claim 1, wherein the communication device comprises at least one of a cellular phone, computer, and portable digital assistant.

13. The method of claim 1, wherein the second signal comprises at least one of an email, SMS message, voicemail, and phone call.

14. The method of claim 1, wherein the registration information is received from the battery system.

15. The method of claim 1, wherein the registration information is received from the communication device.

16. A battery system for monitoring a battery-operated electronic device, the system comprising:
- a housing for receiving in and removing from the battery-operated device, the housing configured to selectively receive one or more battery cells for operating the battery-operated device;
- an electronic processor for monitoring electrical activity of the one or more battery cells; and
- a wireless communication module for communicating with a remote electronic device via a network based on the electrical activity, wherein the wireless communication module is contained in the housing.

17. The system of claim 16, the wireless communication module for transmitting a signal during use of the battery system, the signal comprising the unique identity of the battery system.

18. The system of claim 17, wherein the signal includes data relating to use of the one or more battery cells by the battery-operated device.

19. The system of claim 16, wherein the wireless communication module transmits the signal in response to a change in state of the one or more battery cells.

20. The system of claim 16, wherein the wireless communication module transmits the signal in response to an electrical parameter monitored by the processor exceeding a predetermined threshold.

21. The system of claim 16, wherein the housing contains the one or more battery cells, the electronic processor, and the wireless communication module, when the housing is received in the battery-operated device and when the housing is removed from the battery-operated device.

22. The system of claim 21, the housing having electrical connections for coupling electrically with corresponding electrical connections of the battery-operated device to allow the one or more battery cells to operate the battery-operated device when the housing is received in the battery-operated device.

23. The system of claim 16, wherein the network comprises a wide area network.

24. The system of claim 23, wherein the remote electronic device comprises a server.

25. The system of claim 16, wherein the network comprises a local area network.

26. The system of claim 25, wherein the remote electronic device comprises a base station for communicating with a second remote electronic device via a wide area network based on the electrical activity.

27. An apparatus for monitoring a battery-operated electronic device, the apparatus comprising:
- a housing for receiving in and removing from the battery-operated device, the housing configured to selectively receive one or more battery cells for operating the battery-operated device;
- an electronic processor;
- a wireless communication module in the housing;
- a memory comprising processor executable code and/or data, the processor executable code, when executed by the processor, configures the apparatus to:
  - monitor electrical activity of the one or more battery cells; and
  - communicate, via the wireless communication module, with a remote electronic device via a network based on the electrical activity.

28. A battery system for monitoring a battery-operated electronic device, the system comprising:
- a housing for receiving in and removing from the battery-operated device, the housing configured to selectively receive one or more battery cells for operating the battery-operated device;
- processor means for monitoring electrical activity of the one or more battery cells; and
- communication means in the housing, for communicating with a remote electronic device via a network based on the electrical activity.

29. A method of controlling a battery-operated electronic device from a remote electronic device, the battery-operated electronic device having a battery system for operating electronic device, the battery system having one or more battery cells and a wireless communication module, the method comprising:
- receiving, at the remote electronic device, registration information for the battery system of the battery-operated electronic device, the registration information comprising a unique identity of the battery system;
- receiving, at the remote electronic device, a first signal from a communication device, the first signal corresponding to the unique identity of the battery system; and
- sending a second signal from the remote electronic device to the battery system based on the unique identity in response to receiving the first signal, the second signal for controlling the battery-operated electronic device based on the first signal;
- wherein receiving the registration information and receiving the first signal comprising receiving from the battery system wireless communication module.

30. The method of claim 29, wherein the remote electronic device comprises a server.

31. The method of claim 29, wherein the communication device comprises at least one of a cellular phone, computer, and portable digital assistant.

32. The method of claim 29, wherein the first signal comprises at least one of an email, SMS message, voicemail, and phone call.

33. The method of claim 29, wherein the registration information is received from the battery system.

34. The method of claim 29, wherein the registration information is received from a communication device.

35. A battery system for controlling a battery-operated electronic device, the system comprising:
- a housing for receiving in and removing from the battery-operated device;
- one or more battery cells arranged within the housing, the one or more battery cells for operating the battery-operated device;
- a wireless communication module located in the housing, for receiving a signal from a remote electronic device via a network; and
- an electronic processor for controlling electrical activity of the one or more battery cells based on the signal.

36. The system of claim 35, wherein the housing contains the one or more battery cells, the electronic processor, and the wireless communication module, when the housing is received in the battery-operated device and when the housing is removed from the battery-operated device.

37. The system of claim 36, the housing having electrical connections for coupling electrically with corresponding electrical connections of the battery-operated device to allow the one or more battery cells to operate the battery-operated device when the housing is received in the battery-operated device.

38. The system of claim 35, wherein the network comprises a wide area network.

39. The system of claim 38, wherein the remote electronic device comprises a server.

40. An apparatus for controlling a battery-operated electronic device, the apparatus comprising:
 a housing for receiving in and removing from the electronic device;
 one or more battery cells arranged within the housing, the one or more battery cells for operating the electronic device;
 a wireless communication module for receiving a signal from a remote electronic device via a network, the wireless communication module arranged within the housing;
 an electronic processor;
 a memory comprising processor executable code and/or data, the processor executable code, when executed by the processor, configures the apparatus to:
  control electrical activity of the one or more battery cells; and
  communicate, via the wireless communication module based on the signal.

41. A battery system for controlling a battery-operated electronic device, the system comprising:
 a housing for receiving in and removing from the battery-operated device;
 battery means for operating the battery-operated device, the battery means arranged within the housing;
 communication means for receiving a signal from a remote electronic device via a network, the communication means arranged within the housing; and
 processor means for controlling electrical activity of the one or more battery cells based on the signal.

42. The method of claim 16, wherein the one or more battery cells are for receiving in and removing from the housing.

43. The method of claim 28, wherein the electrical activity is monitored without a request from the remote electronic device.

44. The system of claim 16, wherein the battery-operated device is configured to receive at least one standard battery having a predefined size or shape, and wherein the housing has a size or shape corresponding to the predefined size or shape of the at least one standard battery.

45. The system of claim 44, wherein the size or shape of the housing corresponds to a size or a shape of at least one standard 9V battery, AA battery, AAA battery, C battery, D battery or lantern battery.

46. The apparatus of claim 27, wherein the battery-operated device is configured to receive at least one standard battery having a predefined size or shape, and wherein the housing has a size or shape corresponding to the predefined size or shape of the at least one standard battery.

47. The apparatus of claim 46, wherein the size or shape of the housing corresponds to a size or a shape of at least one standard 9V battery, AA battery, AAA battery, C battery, D battery or lantern battery.

48. The system of claim 28, wherein the battery-operated device is configured to receive at least one standard battery having a predefined size or shape, and wherein the housing has a size or shape corresponding to the predefined size or shape of the at least one standard battery.

49. The system of claim 48, wherein the size or shape of the housing corresponds to a size or a shape of at least one standard 9V battery, AA battery, AAA battery, C battery, D battery or lantern battery.

50. The system of claim 16, wherein the housing is configured to be removable from the battery-operated electronic device to disconnect the battery system from the battery-operated electronic device and wherein the wireless communication module is configured to communicate with the remote electronic device when the battery system is disconnected from the battery-operated electronic device.

51. The system of claim 28, wherein the housing is removable from the battery-operated electronic device to disconnect the battery system from the battery-operated electronic device and wherein the communication means includes means for communicating with the remote electronic device when the battery system is disconnected from the battery-operated electronic device.

* * * * *